United States Patent [19]

Nagaoka et al.

[11] Patent Number: 5,292,050
[45] Date of Patent: Mar. 8, 1994

[54] WIRE BONDER

[75] Inventors: Tetsuya Nagaoka; Kazuhiro Yamamori, both of Yokohama, Japan

[73] Assignee: Kabushuki Kaisha Toshiba, Kawasaki, Japan

[21] Appl. No.: 985,111

[22] Filed: Dec. 3, 1992

[30] Foreign Application Priority Data

Dec. 6, 1991 [JP] Japan ................... 3-322626

[51] Int. Cl.⁵ .............................. H01L 21/603
[52] U.S. Cl. ............................. 228/4.5; 228/9
[58] Field of Search ............. 228/179, 102, 4.5, 7, 228/9; 219/56.21, 56.22

[56] References Cited

U.S. PATENT DOCUMENTS

| | | | |
|---|---|---|---|
| 4,301,958 | 11/1981 | Hatakenaka et al. | 228/4.5 |
| 4,976,393 | 12/1990 | Nakajima et al. | 228/180.5 |
| 5,126,823 | 6/1992 | Otsuka et al. | 357/70 |

FOREIGN PATENT DOCUMENTS

| | | |
|---|---|---|
| 55-118643 | 9/1980 | Japan . |
| 60-41236 | 3/1985 | Japan . |
| 2-114545 | 4/1990 | Japan . |

*Primary Examiner*—Samuel M. Heinrich
*Attorney, Agent, or Firm*—Finnegan, Henderson Farabow, Garrett & Dunner

[57] ABSTRACT

A wire bonder comprises a pattern recognition mechanism. The pattern recognition mechanism includes a TV camera head, a camera control unit, a program research unit, and a bonder controller. The bonder controller includes a microcomputer, a control circuit, and a servo drive unit. The TV camera head and camera control unit detect locations of a first bonding pad formed on a first semiconductor chip and a second bonding pad formed on a second semiconductor chip. The program research unit calculates amounts of shift of the detected locations of the first and second bonding pads from reference locations thereof. The microcomputer corrects locations of first and second bonding points and those of first and second cutting points in accordance with the calculated amounts of shift. The control circuit and servo drive unit control the first and second bonding points and the first and second cutting points based on the corrected locations.

8 Claims, 5 Drawing Sheets

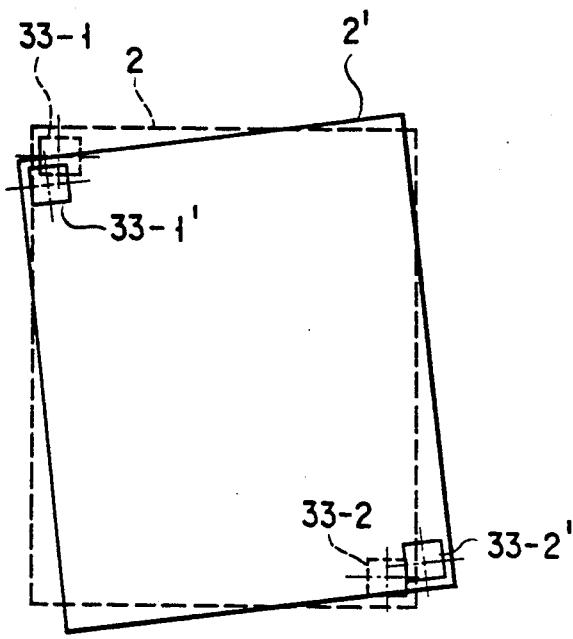
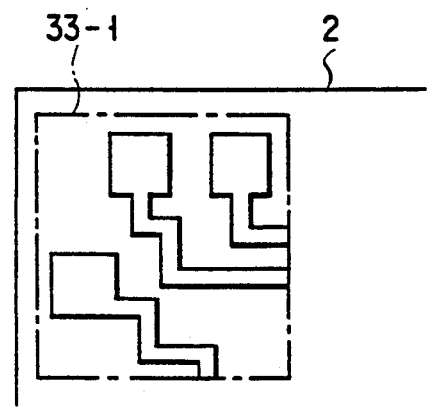
FIG. 6A
FIG. 6B
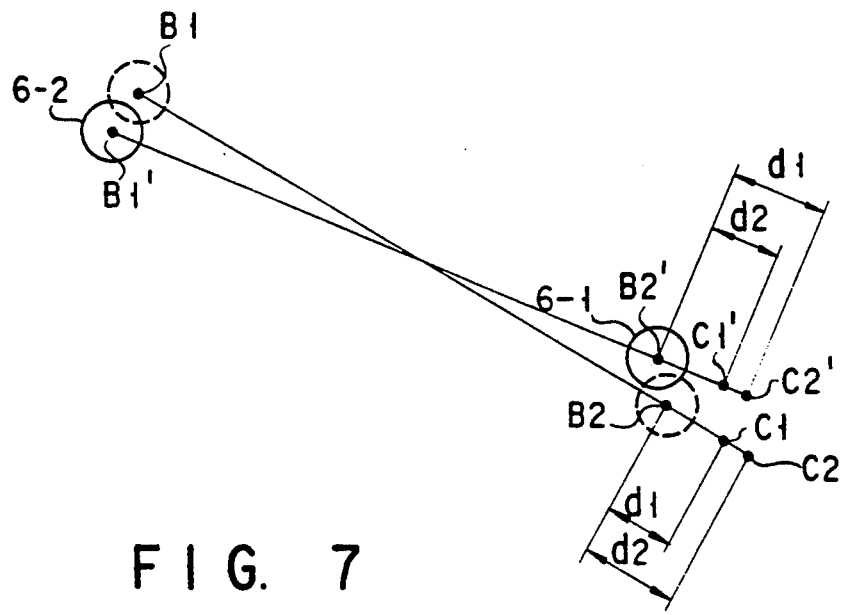
FIG. 7

WIRE BONDER

BACKGROUND OF THE INVENTION

1. Field of the Invention

The present invention relates to a wire bonder for electrically bonding chips together by a bonding wire, for example, in a multichip package, and a wire bonding method using the wire bonder.

2. Description of the Related Art

In a multichip package, a plurality of chips is sealed in one package. This type of multichip package is disclosed in U.S. Pat. No. 5,126,823. In the multichip package, there is a case where a pad formed on a chip is bonded to a pad formed on another chip by a bonding wire. To electrically bond different chips together, a wire bonding method using ball bonding and wedge bonding is known. This method is described in the paragraph of "Prior Art" of Published Unexamined Japanese Patent Application No. 2-114545. The method includes first and second bonding steps. The first bonding step is executed by the ball bonding in which a wire is bonded to a bonding pad on a first semiconductor chip using a metal ball formed at the end of a capillary. The second bonding step is executed by the wedge bonding in which the wire extended from the first semiconductor chip, which is formed line a loop, is bonded to a bonding pad on a second semiconductor chip, and then cut.

A method of forming a metal ball on the bonding pad on the second semiconductor chip in advance in the second bonding step, is disclosed in Published Unexamined Japanese Patent Applications Nos. 2-114545 and 60-41236. According to this method, the metal ball is previously formed on the bonding pad (second bonding point) on the second semiconductor chip before the first bonding step. After the first bonding step, the wire extended from a first bonding point is bonded to the metal ball by the wedge bonding. When the metal ball is formed at the second bonding point, a wire cutting point has to be located at a predetermined distance d1 from the second bonding point. Further, when the wire extended from the first bonding point is bonded to the metal ball, a wire cutting point has to be located at a predetermined distance d2 (d2>d1) from the second bonding point.

Conventionally, an operator of the wire bonder calculates coordinates of the first and second bonding points and distances d1 and d2 (coordinates of the wire cutting points) and inputs the calculated coordinates to the wire bonder as data of bonding.

In the aforementioned bonding method, however, if the mount locations of the first and second semiconductor chips are shifted from each other, the operator has to correct the coordinates of the first and second bonding points and those of the wire cutting points to input them to the wire bonder. For this reason, the calculation of the coordinates is complicated when a plurality of wires is bonded to semiconductor chips. When bonding is executed, the facing sides of two semiconductor chips do not often cross a wire extending from the first bonding point at right angles. If the mount locations of the chips are shifted from each other, both a bonding point of a metal ball and a wire cutting point are shifted from the extended wire. This shift deforms a loop of the wire, that is, an under loop or a loop curl is formed. Therefore, the wire contacts the semiconductor chips to cause a short circuit or the wires contact each other, causing a defective chip.

SUMMARY OF THE INVENTION

A first object of the present invention is to provide a wire bonder for easily bonding semiconductor chips together.

A second object of the present invention is to provide a wire bonding method for easily bonding semiconductor chips together.

To attain the first object, there is provided a wire bonder comprising:

bonding means for bonding a first bonding pad formed on a first semiconductor chip and a second bonding pad formed on a second semiconductor chip by a bonding wire, the bonding means forming a metal ball at a second bonding point on the second bonding pad, cutting the bonding wire at a first cutting point separated from the second bonding point, bonding the bonding wire to a first bonding point on the first bonding pad by ball bonding, extending the bonding wire from the first bonding point to bond the wire to the metal ball by wedge bonding, and cutting the bonding wire at a second cutting point separated from the second bonding point;

pattern recognition means for detecting the first bonding pad and the second bonding pad;

shift amount calculation means for calculating amounts of shift of the first bonding pad and the second bonding pad detected by the pattern recognition means from reference locations;

correction means for correcting locations of the first bonding point, the second bonding point, the first cutting point, and the second cutting point in accordance with the amounts of shift calculated by the shift amount calculation means; and control means for controlling the bonding means in response to a signal output from the correction means.

To attain the second object, there is provided a wire bonding method for bonding a first bonding pad formed on a first semiconductor chip and a second bonding pad formed on a second semiconductor chip to each other by a bonding wire, comprising the steps of:

forming a first metal ball at a distal end of the bonding wire in a capillary, and moving the capillary to a first bonding point on the second bonding pad to bond the bonding wire to the second bonding pad;

moving the capillary to a first cutting point separated from the first bonding point by a first distance to cut the bonding wire;

forming a second metal ball at the distal end of the bonding wire in the capillary, and moving the capillary to a second bonding point on the second bonding pad to bond the bonding wire to the second bonding pad;

moving the capillary from the second bonding point to the first bonding point to form a loop of the bonding wire extended from the second bonding point to the first bonding point;

wedge-bonding the bonding wire extended from the second bonding point to the first bonding point, to the first metal ball; and moving the capillary to a second cutting point separated from the second bonding point by a second distance greater than the first distance, to cut the bonding wire.

According to the wire bonder and the wire bonding method described above, an operator does not have to calculate the coordinates of the first and second wire cutting points, nor does he or she rectify the coordinates of the first and second bonding points or those of the first and second cutting points when the mount locations of the first and second semiconductor chips are shifted. The operator can avoid these complicated operations. Consequently, the semiconductor chips can easily be bonded together. Since the bonding wire can be bonded or cut at the optimum location, abnormality of a loop of the wire can be lessened, and reliability of the wire bonding can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are plan views for explaining pattern recognition using the pattern recognition mechanism shown in FIG. 3, and for explaining how to calculate an amount of shift of a pattern from a semiconductor chip for wire bonding; and FIG. 7 is a view for explaining how to correct a cutting point of a bonding wire.

DETAILED DESCRIPTION OF THE PREFERRED EMBODIMENTS

FIGS. 1A to 1D show wire bonding steps of a wire bonding method according to an embodiment of the present invention. A semiconductor chip 2 mounted on a lead frame 1 and a semiconductor chip 4 mounted on a lead frame 3 are arranged at a predetermined interval.

Figure 1A:
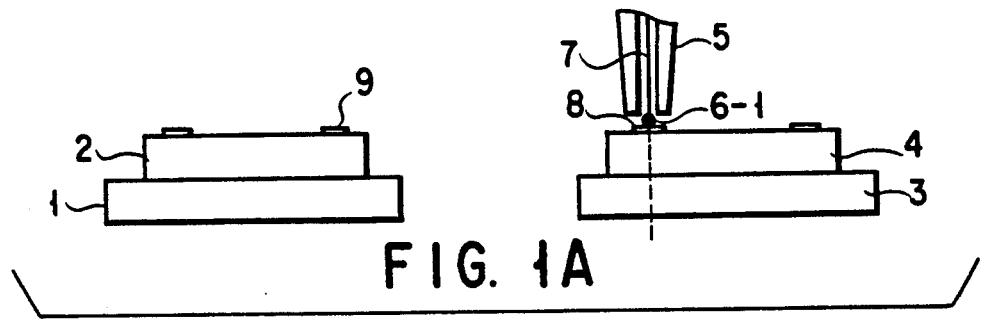
FIGS. 1A to 1D are side views sequentially showing wire bonding steps of a wire bonding method according to an embodiment of the present invention.

As shown in FIG. 1A, ball bonding is executed to form a metal ball 6-1 on a bonding pad 8 of the semiconductor chip 4. More specifically, the metal ball 6-1, which is formed at a distal end of a capillary 5, is moved to a preset bonding point B1 on the pad 8 of the chip 4 to fix the metal ball 6-1 to the bonding point B1. After that, the capillary 5 is slightly shifted from the bonding point B1 to a cutting point C1 by a distance d1, as shown in FIG. 1B, and a wire 7 is cut at the cutting point C1.

Figure 1B:
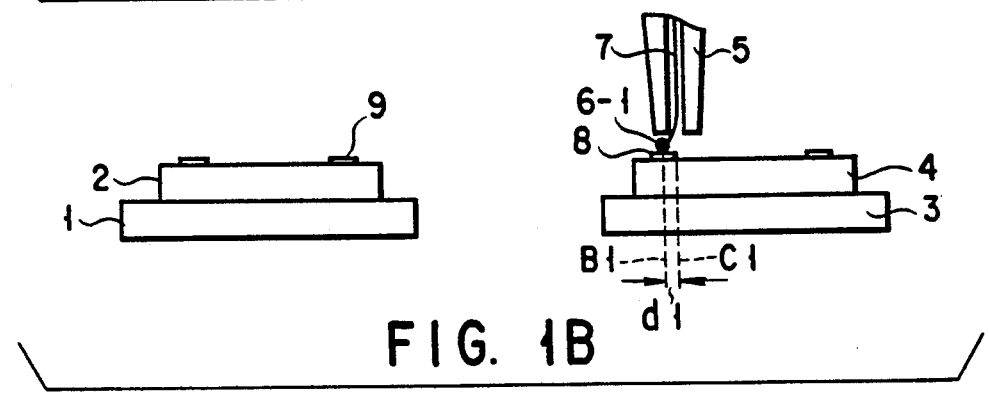
Figure 1C:
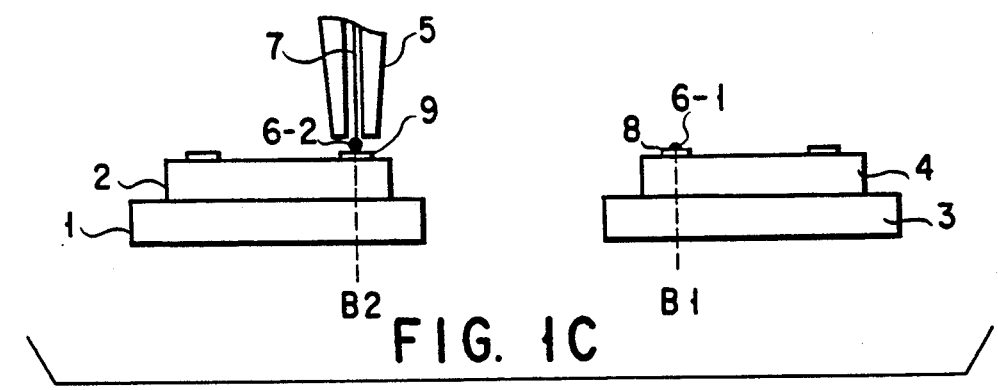

To form another metal ball 6-2 on a bonding pad 9 for wire bonding on the semiconductor chip 2 as shown in FIG. 1C, the metal ball 6-2, which is formed at the distal end of the capillary 5, is first moved to a preset bonding point B2 on the pad 9 of the chip 2. Then, the metal ball 6-2 is bonded to the pad 9, and the capillary 5 is moved toward the chip 4. The wire 7 is thus extended in the form of a loop. After the wire 7 is wedge-bonded to the metal ball 6-1 at the bonding point B1, the capillary 5 is slightly shifted from the bonding point B1 to a cutting point C2 by a distance d2, and the wire 7 is cut at the cutting point C2, as shown in FIG. 1D.

Figure 2:
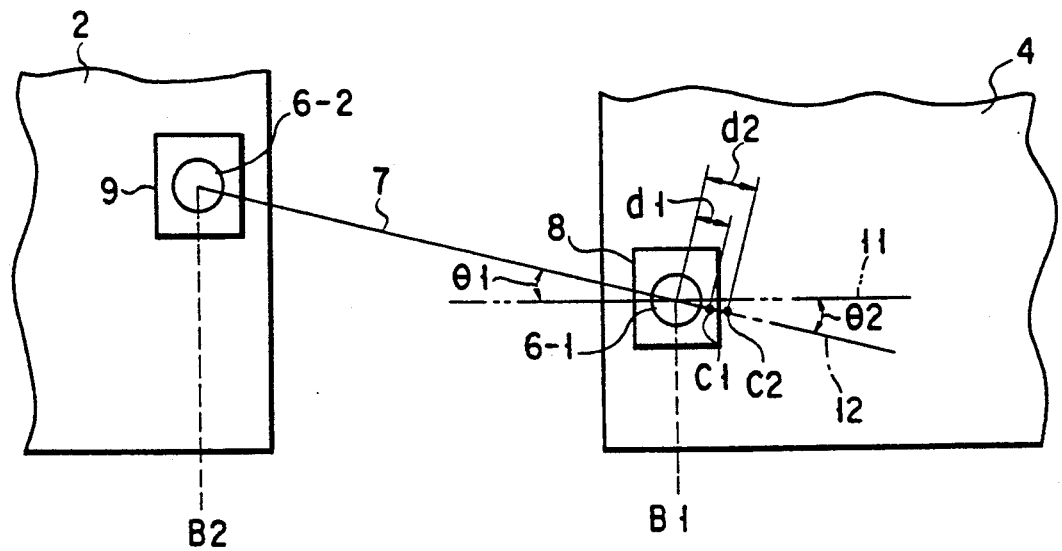
FIG. 2 is a plan view showing a relationship in location between bonding points of semiconductor chips and a bonding wire, and bonding wire cutting points, after the wire is bonded to the semiconductor chips.

FIG. 2 is a plan view showing a relationship in location between the bonding points B1 and B2 of pads 8 and 9 and the cutting points C1 and C2 after the wire is bonded to the pads 8 and 9. As shown in FIG. 2, the pad 9 on the chip 2 and the pad 8 on the chip 4 are connected to each other by the wire 7. It is desirable that an angle $\theta_1$ between the wire 7 and a perpendicular 11 to the side of chip 4 crossing the wire 7 be equal to an angle $\theta_2$ between the perpendicular 11 and an extension 12 of a straight line connecting the bonding point B1 and the cutting point C1.

Figure 1D:
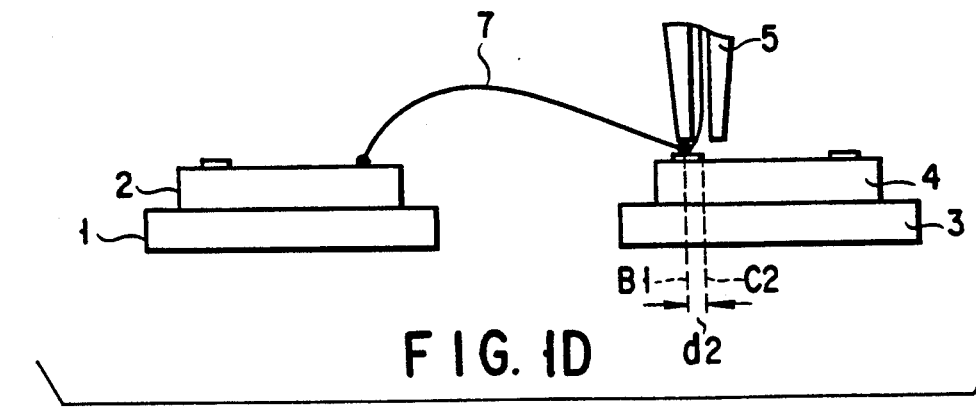

Since, in this embodiment, the coordinates of the bonding point B1, those of the bonding point B2, distances d1 and d2, and diameter D of the wire 7 are self-taught in the pattern recognition mechanism of the bonder, the coordinates of the cutting points C1 and C2 are calculated to cut the wire 7 in the steps shown in FIGS. 1B and 1D.

The setting of the bonding points B1 and B2 and that of the cutting points C1 and C2 will now be described in detail.

Figure 3:
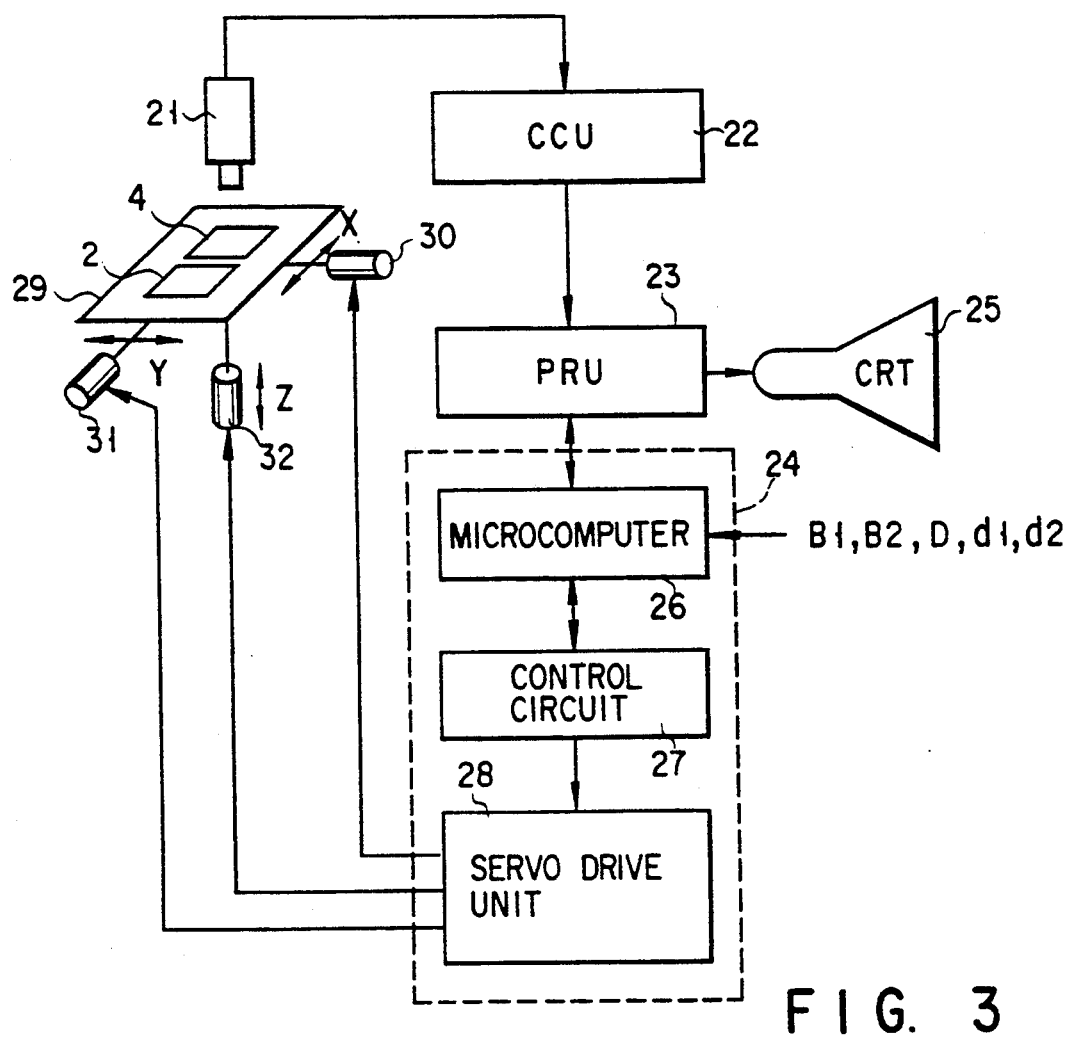
FIG. 3 is a block diagram schematically showing a constitution of a pattern recognition mechanism of a wire bonder according to an embodiment of the present invention.

FIG. 3 is a block diagram schematically showing a pattern recognition mechanism of the wire bonder. This pattern recognition mechanism comprises a TV camera head 21 for monitoring bonding portions of the semiconductor chips 2 and 4 and their peripheries, a CCU (camera control unit) 22, a PRU (program research unit) 23, a bonder controller 24, and a monitor 25 such as a CRT. The bonder controller 24 includes a microcomputer 26, a control circuit 27 and a servo drive unit 28. An operator inputs data indicative of the coordinates of the bonding points B1 and B2, the diameter D of the wire 7, and distances d1 and d2 to the bonder controller 24 (microcomputer 26).

A video signal transmitted from the TV camera head 21, is amplified by an amplifier in the CCU 22, and then supplied to the PRU 23 in synchronization with horizontal and vertical sync signals. The PRU 23 allows the data to be displayed on the monitor 25 and detects an amount of shift of a recognized pattern from a reference pattern. In accordance with the amount of shift, the bonder controller 24 controls operations of an x-axis motor 30, a y-axis motor 31, and a z-axis motor 32 for moving a stage 29 in x-, y-, and z-directions, respectively, with the result that the wire bonding is executed by the steps shown in FIGS. 1A to 1D.

Figure 4:
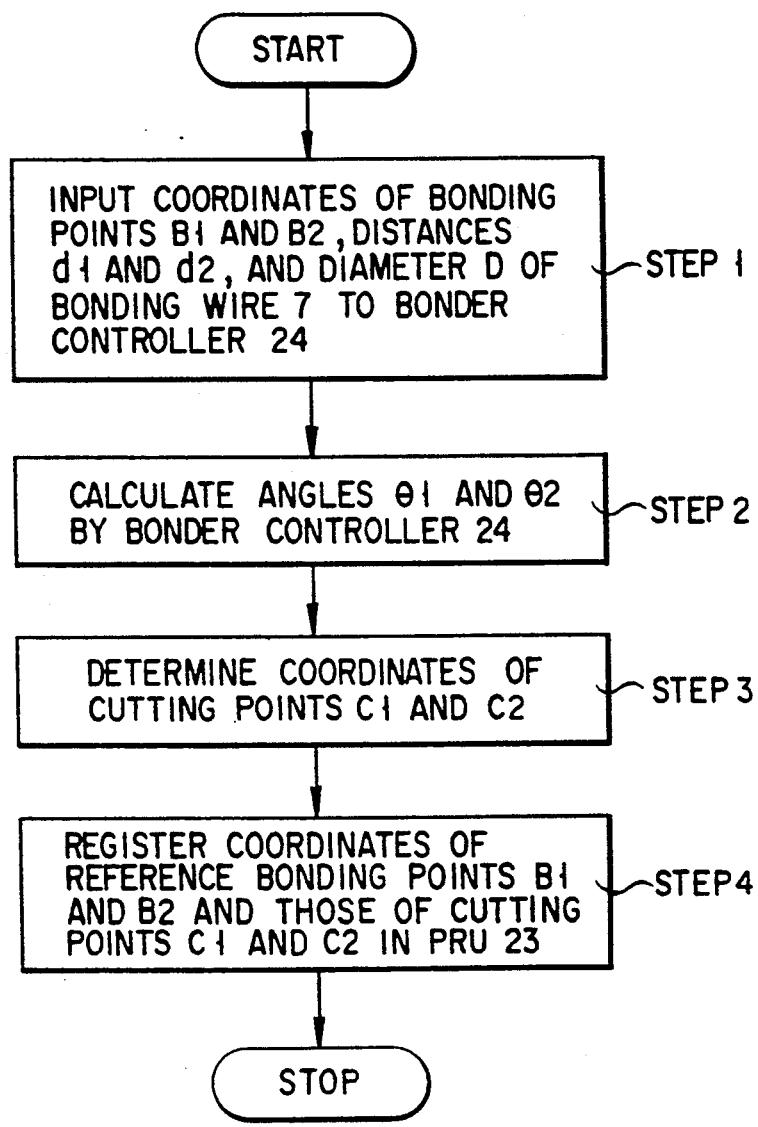
FIG. 4 is a flowchart showing a process of registering the coordinates of a reference pattern in the wire bonder shown in FIG. 3.

Prior to the above wire bonding, the coordinates of the reference pattern is registered in the bonder controller 24 according to the flowchart shown in FIG. 4. First, the coordinates of the bonding points B1 and B2, distances d1 and d2, and diameter D of the bonding wire 7 are input to the bonder controller 24 (step 1). Then, the microcomputer 26 calculates the angles $\theta_1$ and θ2 based on the coordinates of the bonding points B1 and B2 (step 2). The coordinates of the cutting points C1 and C2 are determined based on the angles θ1 and θ2 calculated by the microcomputer 6 and the input distances d1 and d2 (step 3). The coordinates of the bonding points B1 and B2 and those of the cutting points C1 and C2 are registered in a memory provided in the PRU 23 (step 4).

Figure 5:
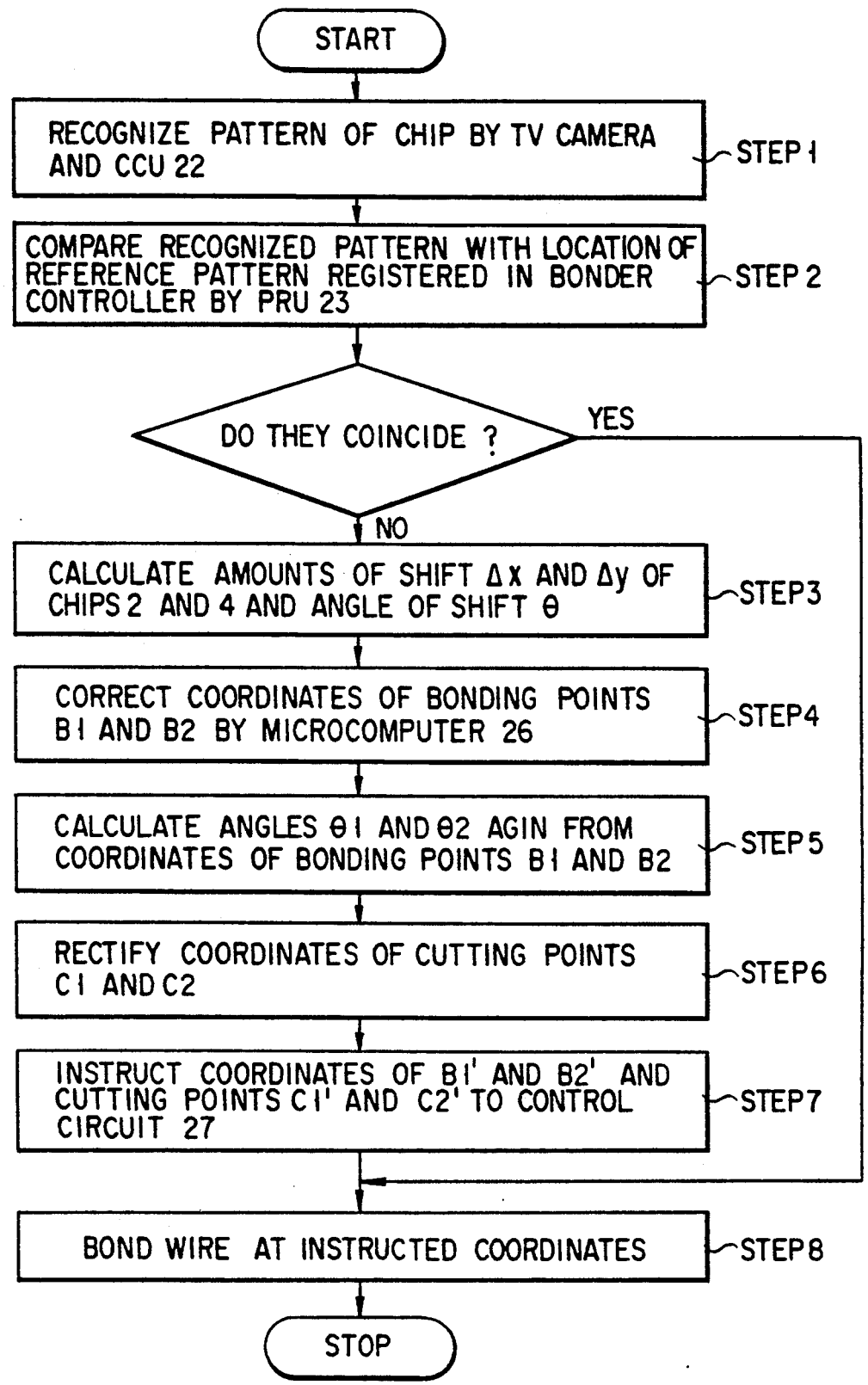
FIG. 5 is a flowchart showing an operation of wire bonding using the pattern recognition mechanism shown in FIG. 3.

After the coordinates of the reference pattern are registered in the memory, the wire is bonded according to the flowchart shown in FIG. 5. First, a pattern of the semiconductor chip 2 is recognized by the TV camera head 21 and the CCU 22 (step 1). Pattern registration areas 33-1 and 33-2 are formed in the two corners on a diagonal of the chip 2, as indicated by a broken line in FIG. 6A. These pattern registration areas are pattern-recognized to detect pattern registration areas 33-1' and 33-2'. For example, the pattern registration area 33-1 is a pattern of a pad formed in the corner of the chip 2, as shown in FIG. 6B. The same is true of the pattern registration area 33-2. The coordinates of the pattern registration areas 33-1 and 33-2 and those of the pattern registration areas 33-1' and 33-2' detected by the pattern recognition, are compared by the PRU 23 (step 2). It is thus checked whether the preregistered reference mount locations (indicated by broken lines) coincide with the detected mount locations (indicated by solid lines).

The same operation is performed for the semiconductor chip 4. If neither detected mount location shifts from its corresponding reference mount location on both the chips 2 and 4, the wire is bonded between the bonding pads 8 and 9 on the basis of the data representing the coordinates of the bonding points B1 and B2, those of the cutting points C1 and C2, distances d1 and d2, and angles θ1 and θ2 which are preregistered in the microcomputer 26 (step 8).

If the detected mount locations shift from the reference mount locations, amounts of shift Δx and Δy in the x and y directions of each of the pads 8 and 9, and an angle of shift θ in the rotating direction thereof, are obtained (step 3). The coordinates of the bonding points B1 and B2 preregistered based on the amounts of shift Δx and Δy and the angle of shift θ are corrected by the microcomputer 26 (step 4).

The angles θ1 and θ2 are calculated again by the microcomputer 26 on the basis of the corrected bonding points B1 and B2 (step 5), and the coordinates of the cutting points C1 and C2 are rectified (step 6) as follows. As described above, data of the distances d1 and d2 are input by an operator. Neither of the distances d1 and d2 varies even if the mount locations on the semiconductor chips 2 and 4 are shifted. Assuming that the diameter of the bonding wire is dw, the optimum distances d1 and d2 are expressed by the following equations:

$$d1 = (2.3 \text{ to } 2.5) \times dw \quad (1)$$

$$d2 = (2.6 \text{ to } 3.0) \times dw \quad (2)$$

As shown in FIG. 7, a pattern of a semiconductor chip is recognized to obtain amounts of shift Δx and Δy of the actual bonding points B1' and B2' from reference bonding points B1 and B2, and the coordinates of the cutting points C1 and C2 are corrected based on the amounts of shift Δx and Δy and angle of shift θ, thereby calculating the coordinates of the cutting points C1' and C2'. The coordinates of the bonding points B1' and B2' and those of the cutting points C1' and C2' are instructed to the control circuit 27 (step 7). The control circuit 27 controls the servo drive unit 28 to control the x-, y-, and z-axis motors 30, 31, and 32 and move the stage 29. Consequently, the wire bonding is executed for every coordinate, in accordance with the steps shown in FIGS. 1A to 1D (step 8).

As described above, according to the present invention, an operator does not have to calculate the coordinates of the wire cutting points C1 and C2 or to rectify the coordinates of the bonding points B1 and B2 or those of the cutting points C1 and C2 because of a shift in mount locations. It is thus possible to avoid the complicated calculation. Since the wire is bonded or cut at the optimum position, abnormality of a loop of the wire can be lessened, and reliability of the wire bonding can be improved.

In the above embodiments, data of the distances d1 and d2 is input by the operator. However, the data can be calculated from the diameter D of the wire 7 by the microcomputer 26, based on the above equations (1) and (2).

According to the present invention described above, there can be provided a wire bonder and a wire bonding method capable of easily bonding two semiconductor chips by a bonding wire, while reducing defects in bonding due to abnormality of the shapes of wires, since the bonding points and cutting points can be determined automatically even if the mount locations on the chips are shifted.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A wire bonder comprising:
    bonding means for bonding a first bonding pad formed on a first semiconductor chip and a second bonding pad formed on a second semiconductor chip by a bonding wire, said bonding means forming a metal ball at a second bonding point on the second bonding pad, cutting the bonding wire at a first cutting point separated from the second bonding point, bonding the bonding wire to a first bonding point on the first bonding pad by ball bonding, extending the bonding wire from the first bonding point to bond the wire to the metal ball by wedge bonding, and cutting the bonding wire at a second cutting point separated from the second bonding point;
    pattern recognition means for detecting the first bonding pad and the second bonding pad;
    shift amount calculation means for calculating amounts of shift of the first bonding pad and the second bonding pad detected by said pattern recognition means from reference locations;
    correction means for correcting locations of the first bonding point, the second bonding point, the first cutting point, and the second cutting point in accordance with the amounts of shift calculated by said shift amount calculation means; and control means for controlling said bonding means in response to a signal output from said correction means.

2. The wire bonder according to claim 1, wherein said pattern recognition means detects pattern registration areas formed in corners on diagonals of the first and second semiconductor chips to detect the first and second bonding pads.

3. The wire bonder according to claim 2, wherein said pattern recognition means includes a TV camera head and a camera control unit.

4. The wire bonder according to claim 2, wherein said shift amount calculation means calculates angles of shift in an x direction, a y direction, and a rotational direction from the reference locations of the first and second bonding pads, based on locations of the pattern registration areas detected by said pattern recognition means.

5. The wire bonder according to claim 4, wherein said shift amount calculation means compares preregistered reference coordinates of the first and second bonding pads with coordinates of the first and second bonding pads detected by said pattern recognition means to calculate the amounts of shift.

6. The wire bonder according to claim 4, wherein said shift amount calculation means includes a program research unit.

7. The wire bonder according to claim 1, wherein said correction means includes a microcomputer.

8. The wire bonder according to claim 1, wherein said control means includes a microcomputer, a control circuit supplied with a signal output from the microcomputer, and a servo drive unit controlled in response to a signal output from the control circuit, for selectively driving a motor for moving a stage on which the first and second semiconductor chips are placed.

* * * * *